(12) United States Patent
Koyama

(10) Patent No.: US 7,786,958 B1
(45) Date of Patent: Aug. 31, 2010

(54) EL DISPLAY DEVICE AND ELECTRONIC DEVICE

(75) Inventor: Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 19 days.

(21) Appl. No.: 09/666,521

(22) Filed: Sep. 20, 2000

(30) Foreign Application Priority Data

Sep. 24, 1999 (JP) ................................. 11-271235

(51) Int. Cl.
*G09G 3/30* (2006.01)
(52) U.S. Cl. .......................................... 345/76; 345/83
(58) Field of Classification Search .................. 345/45, 345/74.1, 75.1, 76–83; 315/169.1–169.4; 257/72
See application file for complete search history.

(56) References Cited

U.S. PATENT DOCUMENTS

| | | | |
|---|---|---|---|
| 3,909,788 A | | 9/1975 | Kaelin et al. |
| 4,954,746 A | * | 9/1990 | Taniguchi et al. ............ 313/506 |
| 5,003,222 A | * | 3/1991 | Washo ......................... 313/511 |
| 5,452,019 A | | 9/1995 | Fukuda et al. ............... 348/655 |
| 5,587,819 A | * | 12/1996 | Sunohara et al. ............ 349/106 |
| 5,598,021 A | | 1/1997 | O et al. |
| 5,641,991 A | | 6/1997 | Sakoh |
| 5,643,826 A | | 7/1997 | Ohtani et al. .................. 437/88 |
| 5,652,600 A | | 7/1997 | Khormaei et al. |
| 5,659,328 A | * | 8/1997 | Todokoro et al. .............. 345/74 |
| 5,721,562 A | * | 2/1998 | Kawashima et al. ........... 345/76 |
| 5,747,928 A | * | 5/1998 | Shanks et al. ................ 313/498 |
| 5,807,627 A | | 9/1998 | Friend et al. |
| 5,812,105 A | | 9/1998 | Van de Ven |
| 5,882,761 A | | 3/1999 | Kawami et al. |
| 5,886,474 A | * | 3/1999 | Asai et al. ................. 315/169.1 |
| 5,920,080 A | | 7/1999 | Jones |
| 5,923,962 A | | 7/1999 | Ohtani et al. ................ 438/150 |
| 5,990,629 A | * | 11/1999 | Yamada et al. ........... 315/169.3 |
| 6,043,797 A | | 3/2000 | Clifton et al. |
| 6,057,647 A | | 5/2000 | Kurosawa et al. |
| 6,072,450 A | * | 6/2000 | Yamada et al. ................. 345/76 |
| 6,080,031 A | * | 6/2000 | Rogers et al. .................. 445/25 |
| 6,091,381 A | | 7/2000 | Uenuma |

(Continued)

FOREIGN PATENT DOCUMENTS

EP 0 595 649 A1 5/1994

(Continued)

OTHER PUBLICATIONS

JP 10-039791 English abstract.

(Continued)

*Primary Examiner*—Kimnhung Nguyen
(74) *Attorney, Agent, or Firm*—Husch Blackwell Sanders LLP Welsh & Katz

(57) ABSTRACT

In an EL display device in which color purity of each of red, blue and green is different, the EL display device displaying an image of a desired balance of red, blue and green is provided. A video signal supplied to each EL element is gamma (γ)-corrected by a correction circuit, the color purity of each of blue luminescence, green luminescence, and red luminescence is suitably controlled in accordance with the voltage and current of the corrected video signal.

24 Claims, 9 Drawing Sheets

U.S. PATENT DOCUMENTS

| | | | |
|---|---|---|---|
| 6,091,382 A * | 7/2000 | Shioya et al. | 345/76 |
| 6,137,458 A | 10/2000 | Uenuma | |
| 6,147,451 A | 11/2000 | Shibata et al. | |
| 6,147,667 A | 11/2000 | Yamazaki et al. | 345/92 |
| 6,165,824 A | 12/2000 | Takano et al. | |
| 6,175,345 B1 | 1/2001 | Kuribayashi et al. | |
| 6,191,764 B1 | 2/2001 | Kono et al. | |
| 6,246,070 B1 | 6/2001 | Yamazaki et al. | |
| 6,255,705 B1 | 7/2001 | Zhang et al. | |
| 6,259,138 B1 | 7/2001 | Ohtani et al. | |
| 6,259,838 B1 | 7/2001 | Singh et al. | |
| 6,262,531 B1 * | 7/2001 | Inoguchi et al. | 313/506 |
| 6,271,818 B1 | 8/2001 | Yamazaki et al. | 345/92 |
| 6,285,124 B1 * | 9/2001 | Nagayama et al. | 313/506 |
| 6,335,716 B1 | 1/2002 | Yamazaki et al. | 345/92 |
| 6,351,077 B1 | 2/2002 | Koyama | 315/169.3 |
| 6,366,025 B1 * | 4/2002 | Yamada | 315/169.3 |
| 6,373,455 B1 | 4/2002 | Kuribayashi et al. | |
| 6,388,648 B1 | 5/2002 | Clifton et al. | |
| 6,388,652 B1 | 5/2002 | Yamazaki et al. | 345/98 |
| 6,445,005 B1 * | 9/2002 | Yamazaki et al. | 257/72 |
| 6,479,333 B1 | 11/2002 | Takano et al. | |
| 6,518,962 B2 | 2/2003 | Kimura et al. | |
| 6,529,243 B1 * | 3/2003 | von Stein et al. | 348/340 |
| 6,558,993 B2 | 5/2003 | Ohtani et al. | |
| 6,576,926 B1 | 6/2003 | Yamazaki et al. | |
| 6,583,577 B1 * | 6/2003 | Choi et al. | 315/169.3 |
| 6,653,750 B2 | 11/2003 | Komiya | |
| 6,836,067 B1 | 12/2004 | Imai | |
| 6,894,312 B2 | 5/2005 | Yamazaki et al. | |
| 6,965,195 B2 | 11/2005 | Yamazaki et al. | |
| 6,967,129 B2 | 11/2005 | Yamazaki et al. | |
| 7,362,322 B2 | 4/2008 | Kimura et al. | |
| 2002/0011983 A1 | 1/2002 | Yamazaki et al. | 345/92 |
| 2002/0063536 A1 | 5/2002 | Koyama | 315/169.3 |
| 2005/0040401 A1 | 2/2005 | Yamazaki et al. | |
| 2005/0162092 A1 | 7/2005 | Yamazaki et al. | |
| 2006/0077651 A1 | 4/2006 | Yamazaki et al. | |
| 2007/0200113 A1 | 8/2007 | Yamazaki et al. | |

FOREIGN PATENT DOCUMENTS

| | | |
|---|---|---|
| EP | 0 776 147 A1 | 5/1997 |
| EP | 0 859 539 A2 | 8/1998 |
| EP | 0 883 191 A2 | 12/1998 |
| EP | 0 923 067 A1 | 6/1999 |
| EP | 1 031 873 A2 | 8/2000 |
| EP | 1 033 765 A2 | 9/2000 |
| EP | 1085576 | 3/2001 |
| JP | 63-163491 | 7/1988 |
| JP | 4-212284 | 8/1992 |
| JP | 6-27449 | 2/1994 |
| JP | 06-267654 | 9/1994 |
| JP | 7-130652 | 5/1995 |
| JP | 07-169567 | 7/1995 |
| JP | 7-169569 | 7/1995 |
| JP | 8-78519 | 3/1996 |
| JP | 8-096959 | 4/1996 |
| JP | 8-330602 | 12/1996 |
| JP | 9-063770 | 3/1997 |
| JP | 9-148066 | 6/1997 |
| JP | 9-292858 | 11/1997 |
| JP | 9-305139 | 11/1997 |
| JP | 10-039791 | 2/1998 |
| JP | 10-39825 | 2/1998 |
| JP | 10-197897 | 7/1998 |
| JP | 10-214060 | 8/1998 |
| JP | 10-232649 | 9/1998 |
| JP | 10-247588 | 9/1998 |
| JP | 10-247735 | 9/1998 |
| JP | 10-270363 | 10/1998 |
| JP | 10-284252 | 10/1998 |
| JP | 10-312173 | 11/1998 |
| JP | 10-335068 | 12/1998 |
| JP | 11-8073 | 1/1999 |
| JP | 11-54268 | 2/1999 |
| JP | 11-065471 | 3/1999 |
| JP | 11-084425 | 3/1999 |
| JP | 11-87054 | 3/1999 |
| JP | 11-97169 | 4/1999 |
| JP | 11-143379 | 5/1999 |
| JP | 2000-163014 | 6/2000 |
| JP | 2000-340798 | 12/2000 |
| JP | 2001-217072 | 8/2001 |
| WO | WO 98/20682 A1 | 5/1998 |
| WO | WO 98/33165 | 7/1998 |
| WO | WO 98/40871 A1 | 9/1998 |
| WO | WO 98/59528 A1 | 12/1998 |

OTHER PUBLICATIONS

English abstract re Japanese Patent Application No. JP 11-065471, published Mar. 5, 1999.

European Search Report re application No. EP 00119583.3, dated Mar. 14, 2006.

Office Action re Chinese application No. CN 200410090565.X, dated Nov. 13, 2009 (with English translation).

Office Action re Japanese application No. JP 11-271235, dated Mar. 30, 2010 (with English translation).

English Abstract re Japanese Patent Application No. JP 7-130652, published May 19, 1995.

English Abstract re Japanese Patent Application No. JP 8-096959, published Apr. 12, 1996.

English Abstract re Japanese Patent Application No. JP 8-330602, published Dec. 13, 1996.

English Abstract re Japanese Patent Application No. JP 9-063770, published Mar. 7, 1997.

English Abstract re Japanese Patent Application No. JP 10-270363, published Oct. 9, 1998.

* cited by examiner

EL DISPLAY DEVICE AND ELECTRONIC DEVICE

BACKGROUND OF THE INVENTION

1. Field of the Invention

The present invention is related to an EL (electroluminescence) display device formed by a semiconductor element (an element using a semiconductor thin film, typically a thin-film transistor) built on a substrate, and to an electronic device having the EL display device as a display portion.

2. Description of the Related Art

Techniques of forming a thin-film transistor (hereafter referred to as a TFT) on a substrate have greatly advanced in recent years, and development of applications to active matrix display devices is proceeding. In particular, a TFT using a polysilicon film has a higher electric field effect mobility than a TFT using a conventional amorphous silicon film, and therefore it is capable of high speed operation. It therefore becomes possible to perform control of a pixel, conventionally performed by a driver circuit external to the substrate, by a driver circuit formed on the same substrate as the pixel.

This type of active matrix display device is gaining attention for obtaining many advantages, such as lowered manufacturing cost, smaller display device, increased yield, and reduced throughput, by building various circuits and elements on the same substrate.

In addition, research on active matrix EL display devices having EL elements as self-luminescing elements has become spirited. The EL display device is also referred to as organic EL display (OELD) or an organic light emitting diode (OLED).

The EL display device is a self luminescing type which differs from a liquid crystal display device. The EL element has a structure in which an EL layer is sandwiched between a pair of electrodes, and the EL layer is normally a lamination structure. A lamination structure of a hole transporting layer, a light emitting layer, and an electron transporting layer proposed by Tang, et al., of Eastman Kodak Co. can be given as a typical structure. This structure has extremely high light emitting efficiency, and nearly all EL display devices in which research and development is proceeding employ this structure.

Furthermore, additional structures such as a hole injecting layer, a hole transporting layer, a light emitting layer, and an electron transporting layer formed in order on a pixel electrode; or a hole injecting layer, a hole transporting layer, a light emitting layer, an electron transporting layer, and an electron injecting layer formed in order on a pixel electrode may also be used. An element such as a fluorescing pigment may also be doped into the EL layer.

A predetermined voltage is then applied to the EL layer having the above structure by a pair of electrodes, and recombination of a carrier thus occurs in the light emitting layer, and light is emitted.

The EL display device has roughly four colorizing display systems, that is, a system in which an EL element of white luminescence and color filters are combined, a system in which three kinds of EL elements corresponding to R (red), G (green) and B (blue) are formed, a system in which an EL element of blue or blue-green luminescence and a fluorescent material (fluorescent color converting layer: CCM) are combined, and a system in which a transparent electrode is used as a cathode (counter electrode) and EL elements corresponding to RGB are overlapped.

The color filter is a color filter for extracting light of red, green or blue. The color filter is formed at a position corresponding to a pixel, and the color of extracted light at each pixel can be changed by this. This is the same as a colorizing system of a liquid crystal display device using color filters in principal. Note that the position corresponding to the pixel indicates a position coincident with a pixel electrode.

However, the color filter is a filter which extracts the light of a specified wavelength to improve the color purity of the transmitted light. Thus, in the case where a light component of a wavelength to be extracted is small, there can occur such a disadvantage that the brightness of the light of the wavelength is extremely low or the color purity is poor.

In well-known organic EL materials, a red with high luminescent brightness has not been realized, and like an example shown in FIG. 10, the luminescent brightness of red is low as compared with the luminescent brightness of blue or green. In the case where an organic EL material having such luminescent characteristics is used for an EL display device, the luminescent brightness of red of an image to be displayed becomes poor.

Further, a method of using orange color light having a slightly lower wavelength than that of red color light has been conventionally performed because the brightness of red color light is low compared to the brightness of blue and green light. However, in this case the brightness of red color images which are displayed by the EL display device is low, and when display of the red color image is attempted, it is displayed as orange.

SUMMARY OF THE INVENTION

In consideration of the above, an object of the present invention is to provide an EL display device for displaying an image which has a desirable good balance between the brightnesses of red, blue, and green light in EL elements with different brightness of red, blue and green.

According to an aspect of the present invention, an electronic device includes an EL display device having a TFT, a pixel electrode electrically connected to the TFT, an EL element with the pixel electrode as a cathode or an anode, and an insulating layer for sealing the EL element; means for applying an analog image signal to the EL element; and means for gamma ($\gamma$)-correcting the analog image signal.

The above structure may further include a memory for storing data for gamma ($\gamma$) correction.

According to another aspect of the present invention, an EL display device includes, on a same substrate, a TFT, a pixel electrode electrically connected to the TFT, an EL element with the pixel electrode as a cathode or an anode, an insulating layer for sealing the EL element, means for applying an analog image signal to the EL element, and means for gamma ($\gamma$)-correcting the analog image signal.

The above structure may further include a memory for storing data for gamma ($\gamma$) correction on the same substrate.

Besides, in the EL display device, a color filter is formed at a position corresponding to the pixel electrode for colorization.

Besides, for colorization by using another method, the EL element may be formed of a first pixel including a blue luminescent layer, a second pixel including a green luminescent layer, and a third pixel including a red luminescent layer. In this case, the color filter may be used or may not be used.

Besides, in the above EL display device, the gamma ($\gamma$) correction may amplify a signal of red, or may attenuate a signal of blue or green. Besides, the gamma ($\gamma$) correction may be independently made for each of signals of blue, green and red.

By adopting the foregoing structure, even in the case of using an EL material in which a red light component of a wavelength to be extracted by the color filter is small, it is possible to provide an EL display device displaying an image of a desired RGB (red, blue, green) balance by making the gamma (γ) correction to, for example, a video signal to adjust the luminescent brightness of RGB (red, blue, green).

DETAILED DESCRIPTION OF THE PREFERRED EMBODIMENTS

Embodiment-Mode

First, an embodiment mode of carrying out the present invention will be described with reference to FIGS. 1 and 2.

Figure 1:
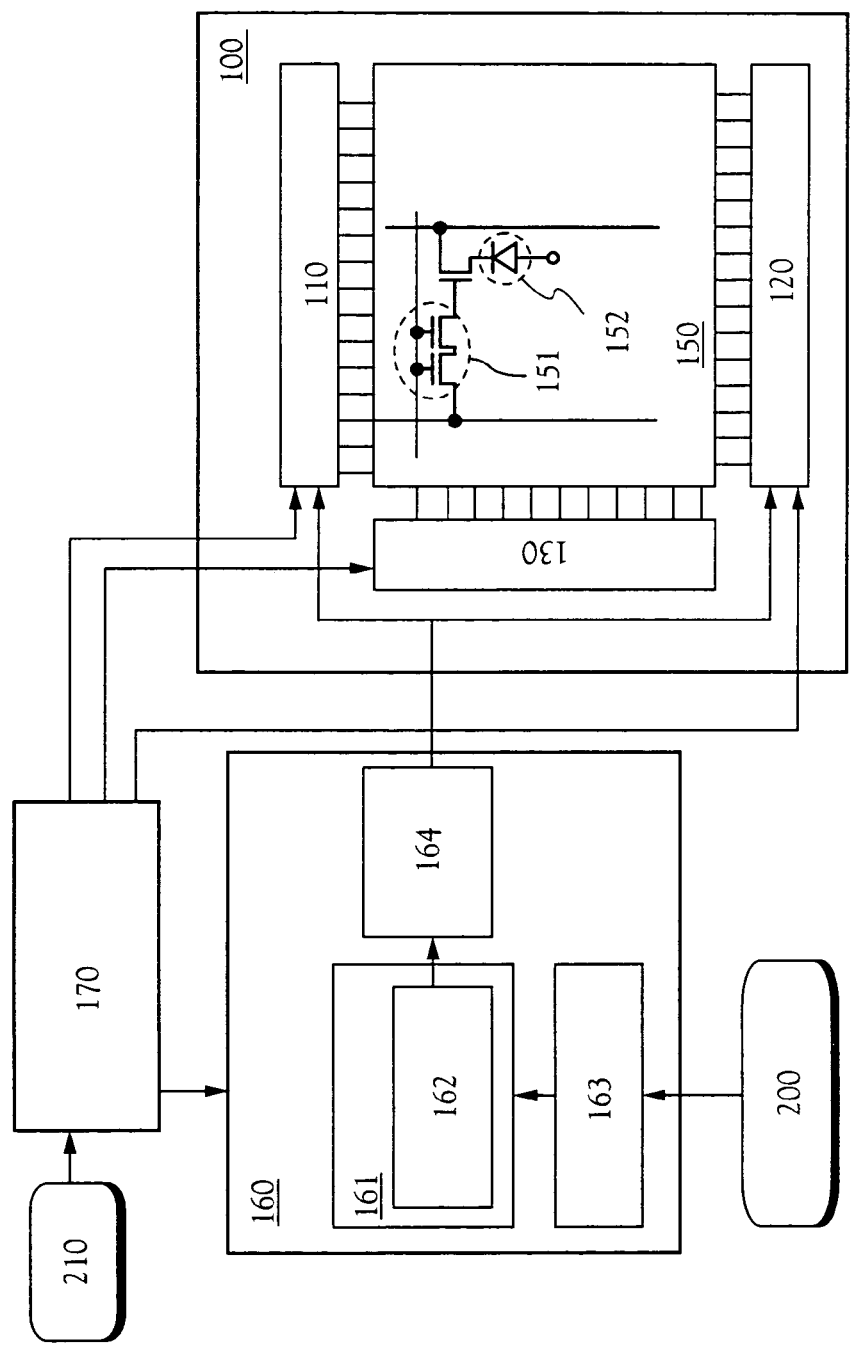
FIG. 1 is a circuit block diagram of an EL display device of the present invention.

FIG. 1 is a block diagram showing an EL display device of the present invention. In FIG. 1, reference numeral 100 designates an active matrix substrate which includes source driver circuits 110 and 120, a gate driver circuit 130, and a pixel portion 150. The pixel portion 150 includes pixels arranged in matrix form, and each pixel includes a TFT 151, an EL element 152, and the like. Although not shown for simplification, in this embodiment, colorization is realized by using color filters corresponding to R (red), G (green) and B (blue).

Reference numeral 160 designates an image signal processing circuit which includes an A/D conversion circuit 163 for converting an analog signal inputted from the outside into a digital signal, a correction circuit 161 for correcting the digital signal, and a D/A conversion circuit 164 for converting the corrected digital signal into an analog signal. The correction circuit 161 includes a correction memory 162. In the display device of the present invention, a video signal 200 is gamma (γ)-corrected. For example, the video signal 200 is corrected on the basis of a gamma (γ) correction table stored in the correction memory.

A control circuit 170 controls various signals supplied to the active matrix substrate 100 and the image signal processing circuit 160. A synchronous signal 210 is inputted to the control circuit 170.

The control circuit 170 is a circuit for forming and supplying pulses (start pulse, clock pulse, synchronous signal, etc.) necessary for controlling the source driver circuits 110 and 120, the gate driver circuit 130, the image signal processing circuit 160, and the like on the basis of the synchronous signal 210.

Note that the control circuit 170 repeats an operation (frequency dividing) for counting a previously set count number (frequency division ratio) of clocks, while the inputted synchronous signal 210 is made a reference and an oscillation clock signal (OSC) outputted from a phase synchronized oscillator is made an original oscillation. The clocks are counted at the same time as this frequency dividing to form a start pulse (S_SP) supplied to the source driver circuit in the horizontal direction of a screen and a clock pulse (S_CK), a start pulse (G_SP) supplied to the gate driver circuit in the vertical direction of a screen and a clock pulse (G_CK), a clock pulse (D_CK), and the like. Further, there is also a case where a horizontal synchronous signal (HSY) and a vertical synchronous signal (VSY) are formed.

The image signal processing circuit 160, the control circuit 170, and the like are mounted on a substrate different from the active matrix substrate 100, for example, another printed substrate, and circuits on the substrate and the active matrix substrate 100 are connected through a cable, a flexible wiring plate, and the like. Note that it is needless to say that it is preferable to make such a structure that a part or all of circuits such as the image signal processing circuit 160, the control circuit 170, and the like are provided on the same substrate as the active matrix substrate since integration and miniaturization are realized.

The video signal 200 inputted to the image signal processing circuit 160 from the outside is an analog signal. The video signal 200 may be an analog signal such as a television signal or a video signal, or may be an analog signal formed by D/A conversion of a data signal from a computer or the like.

In the image signal processing circuit 160, the video signal 200 is converted into a digital video signal by the A/D conversion circuit 163 and is outputted to the correction circuit 161. The correction circuit 161 makes gamma (γ) correction, in view of the luminescent brightness of each EL element, to the inputted digital video signal on the basis of the gamma (γ) correction table stored in the correction memory.

In the gamma (γ) correction, a supplied image signal is corrected in order to obtain excellent gradation display. The gamma (γ)-corrected digital video signal is converted into an analog video signal by the D/A conversion circuit 164 and is supplied to the source driver circuits 110 and 120.

Figure 10:
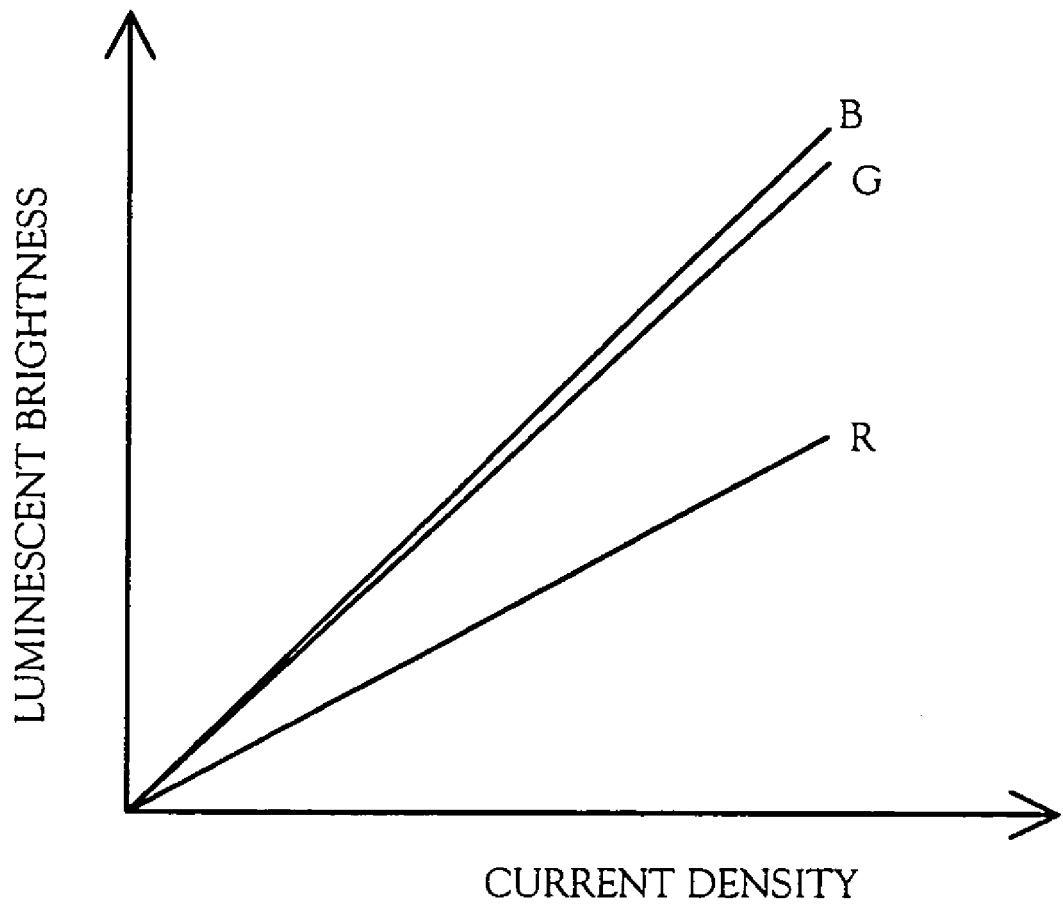
FIG. 10 is a view showing characteristics between the luminescent brightness of EL elements (R, G, B) and current density.

By this correction circuit 161, a video signal supplied to each EL element is gamma (γ)-corrected, and the luminescent brightness of each of blue luminescence, green luminescence and red luminescence can be suitably controlled in accordance with the voltage and current of the corrected analog video signal. For example, in the case where an EL element using three kinds (R, G, B) of color filters as shown n FIG. 10 is used, the video signal (corresponding to R) has only to be gamma (γ)-corrected to increase the luminescent brightness of R so that the luminescent brightness of each color becomes identical. Alternatively, the video signal applied to the EL element (corresponding to B or G) has only to be gamma (γ)-corrected to decrease the luminescent brightness of B or G so that the luminescent brightness of each color becomes identical. In addition, the video signals applied to the respective EL elements may be gamma (γ)-corrected to increase the luminescent brightness of R and to decrease the luminescent brightness of B or G so that the luminescent brightness of each color becomes identical.

Here, an example of a preparation method of the gamma (γ) correction table of the correction memory in the correction circuit of the image signal processing circuit 160 of the present invention will be described.

Figure 2:
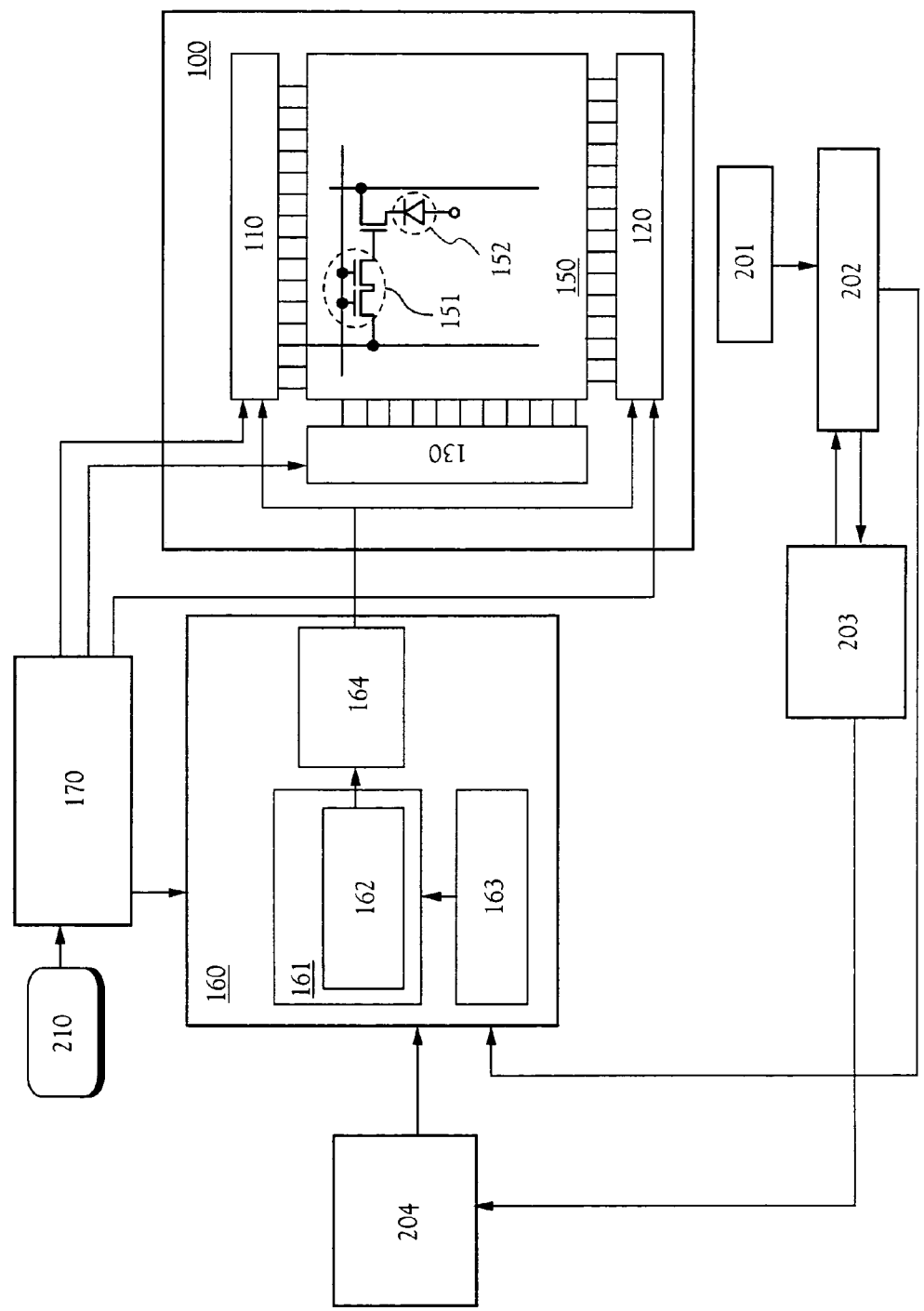
FIG. 2 is a structural view when a gamma (γ) correction table of the EL display device of the present invention is prepared.

Reference will be made to FIG. 2. FIG. 2 is a circuit block diagram in the case where the gamma (γ) correction table of the correction memory in the correction circuit of the image signal processing circuit 160 of the present invention is prepared. Reference numeral 201 designates an image pickup device which converts an image displayed by the luminescence of the EL element into an electric signal.

As the image pickup device 201, another image pickup device such as a CCD camera or a digital video camera can be used. Alternatively, a luminance meter or an illuminance meter for merely measuring the lightness or brightness of a displayed image may be used. In the case where the luminance meter or the illuminance meter is used, it is appropriate that an A/D conversion circuit for converting a signal supplied from these devices into a digital signal is used.

Reference numeral 202 designates a digital signal processor (DSP); 203, a reference signal supply source; and 204, a signal generator (SG).

The correction circuit 161 of the image signal processing circuit 160 gamma (γ)-corrects a digital signal supplied from the signal generator 204, outputs a digital video signal after correction, converts the signal into an analog video signal by the D/A conversion circuit, and sends it to the respective EL elements. The respective EL elements emit light on the basis of the analog video signal supplied from the image signal processing circuit 160 and display an image.

The displayed image is made a digital signal by using the image pickup device 201. The digital signal sent from the image pickup device 200 is supplied to the digital signal processor (DSP) 202. The digital signal processor 202 compares the digital signal supplied from the image pickup device 201 with a digital signal supplied from the reference data supply source 203, and feeds back the discrepancy of the data to the correction circuit 161. Note that the reference data may be directly supplied from the signal generator 204.

In accordance with the signal supplied from the digital signal processor 202, the correction circuit 161 further corrects the digital signal from the signal generator 204, converts it into an analog video signal, and again sends it to the EL element. The respective EL elements emit light on the basis of the analog video signal supplied from the image signal processing circuit 160 and display an image.

The displayed image is again made a digital signal by using the image pickup device 201. The digital signal supplied from the image pickup device 201 is sent to the digital signal processor 202. The digital signal processor 202 compares the digital signal supplied from the image pickup device 201 with the digital signal supplied from the reference data supply source 203, and feeds back the discrepancy to the correction circuit 161.

When suitable data of gamma (γ) correction are obtained in this way, the data are stored at an appointed address of the correction memory 162.

Thereafter, in order to start the correction of a next video signal, the signal generator 204 sends a digital signal different from the previous one to the correction circuit 161. When suitable data of gamma (γ) correction to the digital signal are obtained, the data are stored at an appointed address of the correction memory 162.

When all correction data are stored in the correction memory 162, the signal generator 204 and the digital signal processor 202 are separated from the active matrix substrate 100. Here, the preparation of the gamma (γ) correction table is completed. Note that the method of preparing the gamma (γ) correction table shown here is merely an example, and it is needless to say that the present invention is not particularly limited. Besides, the block circuit diagram of FIG. 1 is also an example, and it is also possible to make gamma (γ) correction by using, for example, a correction circuit without a correction memory.

Thereafter, a digital video signal is supplied to the correction circuit 160, and on the basis of the data of the gamma (Y) correction table stored in the correction memory 161, the digital video signal is corrected, and after the signal is further converted into an analog video signal, it is supplied to the EL element. Since the suitable correction is made to the analog video signal supplied to the EL element by the correction circuit 160, balanced luminescence (red luminescence, green luminescence, and blue luminescence) is obtained and an excellent image is displayed.

The present invention having the above structure will be described in more detail with reference to the following embodiments.

Embodiment 1

In this embodiment, an EL display device provided with a correction circuit will be described with reference to FIG. 1.

FIG. 1 is a block diagram showing an EL display device of this embodiment. In FIG. 1, reference numeral 100 designates an active matrix substrate which includes source driver circuits 110 and 120, a gate driver circuit 130, and a pixel portion 150. The pixel portion 150 includes pixels arranged in matrix form, and each pixel includes a TFT 151, an EL element 152, and the like. Although not shown for simplification, in this embodiment, colorization is realized by using color filters corresponding to R (red), G (green) and B (blue).

Reference numeral 160 designates an image signal processing circuit which includes an A/D conversion circuit 163 for converting an analog signal inputted from the outside into a digital signal, a correction circuit 161 for gamma (γ)-correcting the digital signal, and a D/A conversion circuit 164 for converting the gamma (γ)-corrected digital signal into an analog signal. The correction circuit 161 includes a correction memory 162.

Reference numeral 170 designates a control circuit which controls various signals supplied to the active matrix substrate 100 and the image signal processing circuit 160. A synchronous signal 210 is inputted to the control circuit 170.

The image signal processing circuit 160, the control circuit 170, and the like are mounted on a substrate different from the active matrix substrate 100, for example, another printed substrate, and circuits on the substrate and the active matrix substrate 100 are connected through a cable, a flexible wiring plate, and the like.

A video signal 200 inputted to the image signal processing circuit 160 from the outside is an analog signal such as a television signal or a video signal.

In the image signal processing circuit 160, the video signal 200 is converted into a digital video signal by the A/D conversion circuit 163 and is outputted to the correction circuit 161. The correction circuit 161 makes gamma (γ) correction, in view of the luminescent brightness of each EL element, to the inputted digital video signal on the basis of the gamma (γ) correction table stored in the correction memory. The gamma (γ)-corrected digital video signal is converted into an analog video signal by the D/A conversion circuit 164 and is supplied to the source driver circuits 110 and 120.

The digital video signal is supplied to the correction circuit 160, and on the basis of the data of the gamma (γ) correction table stored in the correction memory 161, the digital video signal is gamma (γ)-corrected, and after the signal is further converted into an analog video signal, it is supplied to the EL element. Since the suitable gamma (γ) correction is made to the analog video signal supplied to the EL element, balanced luminescence (red luminescence, green luminescence, and blue luminescence) is obtained and an excellent image is displayed.

The fabricating method of the EL display device in this embodiment of the present invention are explained using FIGS. 3A to 5C. Note that in order to simplify the explanation, a CMOS circuit is shown as a basic circuit for the driver circuits.

Figure 3A:
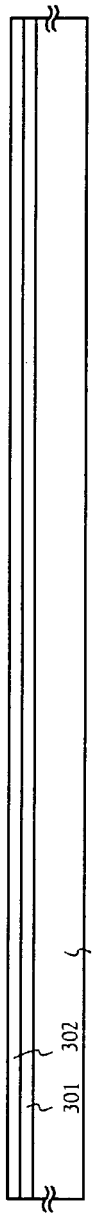
FIGS. 3A to 3E are views showing a fabricating process of an active matrix EL display device of Embodiment 1.

First, as shown in FIG. 3A, a base film 301 is formed with a 300 nm thickness on a glass substrate 300. Silicon nitride oxide films are laminated as the base film 302 in embodiment 1. It is good to set the nitrogen concentration at between 10 and 25 wt % in the film contacting the glass substrate 300.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known technique, forming a crystalline silicon film (also referred to as a polycrystalline silicon film or a polysilicon film) 302. Thermal crystallization using an electric furnace, laser annealing crystallization using a laser, and lamp annealing crystallization using an infrared light exist as known crystallization methods. Crystallization is performed in embodiment 1 using light from an excimer laser which uses XeCl gas.

Note that pulse emission type excimer laser light formed into a linear shape is used in embodiment 1, but a rectangular shape may also be used, and continuous emission argon laser light and continuous emission excimer laser light can also be used.

In this embodiment, although the crystalline silicon film is used as the active layer of the TFT, it is also possible to use an amorphous silicon film. Note that it is possible to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Figure 3B:
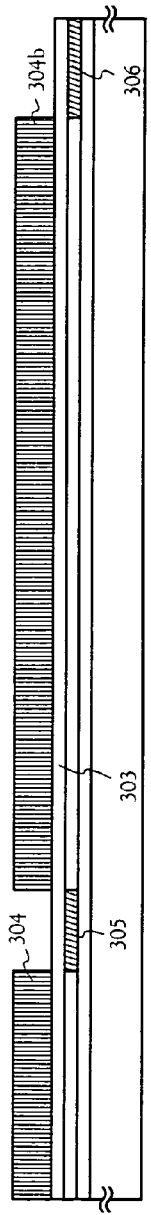

Next, as shown in FIG. 3B, a protecting film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protecting film 303 is provided so that the crystalline silicon film is not directly exposed to plasma during addition of an impurity, and so that delicate concentration control of the impurity is possible.

Resist masks 304a and 304b are then formed on the protecting film 303, and an impurity element which imparts n-type conductivity (hereafter referred to as an n-type zimpurity element) is added. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1\times10^{18}$ atoms/$cm^3$ in embodiment 1. Of course, an ion implantation method, in which separation of mass is performed, may also be used.

The dose amount is regulated so that the n-type impurity element is contained in n-type impurity regions 305 and 306, thus formed by this process, at a concentration of $2\times10^{16}$ to $5\times10^{19}$ atoms/$cm^3$ (typically between $5\times10^{17}$ and $5\times10^{18}$ atoms/$cm^3$).

Figure 3C:

Next, as shown in FIG. 3C, the protecting film 303 is removed, and an activation of the added periodic table group 15 elements is performed. A known technique of activation may be used as the means of activation, and activation is done in embodiment 1 by irradiation of excimer laser light. A pulse emission type excimer laser and a continuous emission type excimer laser may both, of course, be used, and it is not necessary to place any limits on the use of excimer laser light. The object is the activation of the added impurity element, and it is preferable that irradiation is performed at an energy level at which the crystalline silicon film does not melt. Note that the laser irradiation may also be performed with the protecting film 303 in place.

The activation by heat treatment may also be performed along with activation of the impurity element by laser light. When activation is performed by heat treatment, considering the heat resistance of the substrate, it is good to perform heat treatment on the order of 450 to 550° C.

A boundary portion (connecting portion) with regions along the edges of the n-type impurity regions 305 and 306, namely regions along the periphery into which the n-type impurity element, which exists in the n-type impurity regions 305 and 306, is not added, is delineated by this process. This means that, at the point when the TFTs are later completed, extremely good connections can be formed between LDD regions and channel forming regions.

Figure 3D:
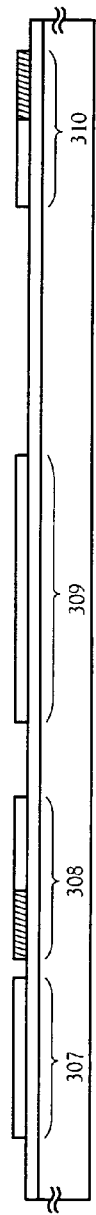

Unnecessary portions of the crystalline silicon film are removed next, as shown in FIG. 3D, and island shape semiconductor films (hereafter referred to as active layers) 307 to 310 are formed.

Figure 3E:
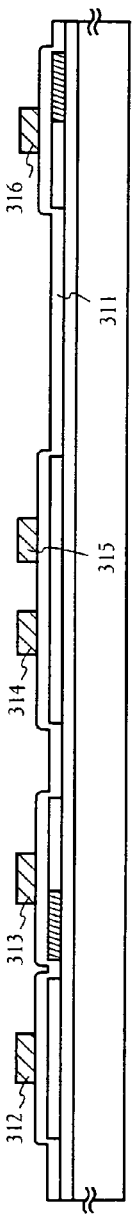

Then, as shown in FIG. 3E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon nitride oxide film is used in embodiment 1.

Next, a conductive film having a thickness of 200 to 400 nm is formed, and patterning is carried out to form gate electrodes 312 to 316. The end portions of the gate electrodes 312 to 316 can also be made taper-shaped. Note that in this embodiment, the gate electrode and an extended wiring line (hereinafter referred to as a gate wiring line) electrically connected the gate electrode are formed of different materials. Specifically, a material having a resistance lower than the gate electrode is used for the gate wiring line. This is because a material which can be finely worked is used for the gate electrode and a material which has a low wiring resistance though fine working can not be made is used for the gate wiring line. Of course, the gate electrode and the gate wiring line may be formed of the same material.

Besides, although the gate electrode may be formed of a conductive film of a single layer, it is preferable to make a laminate film such as a two-layer or three-layer film as the need arises. As the material of the gate electrode, any well-known conductive films may be used. However, as described above, it is preferable to use a material which can be finely worked, specifically, can be patterned into a line width of 2 μm or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film, titanium silicide film). Of course, the films may be used as a single layer or a laminate layer.

In this embodiment, a laminate film of a tungsten nitride (WN) film having a thickness of 50 nm and a tungsten (W) film having a thickness of 350 nm is used. These may be formed by a sputtering method. When an inert gas of Xe, Ne or the like is added as a sputtering gas, film peeling due to stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 4A:
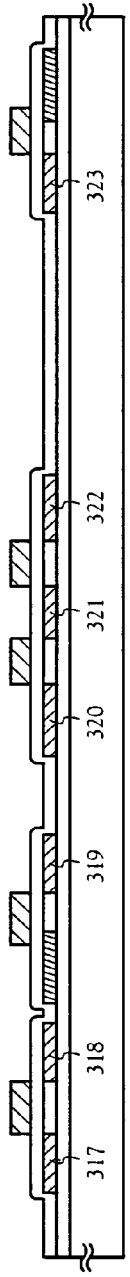
FIGS. 4A to 4D are views showing the fabricating process of the active matrix EL display device of Embodiment 1.

Next, an n-type impurity element (phosphorous is used in embodiment 1) is added in a self-aligning manner with the gate electrodes 312 to 316 as masks, as shown in FIG. 4A. The addition is regulated so that phosphorous is added to impurity regions 317 to 323 thus formed at a concentration of ½ to ¹⁄₁₀ that of the impurity regions 305 and 306 (typically between ⅓ and ¼). Specifically, a concentration of $1 \times 10^{16}$ to $5 \times 10^{18}$ atoms/cm$^3$ (typically $3 \times 10^{17}$ to $3 \times 10^{18}$ atoms/cm$^3$) is preferable.

Figure 4B:
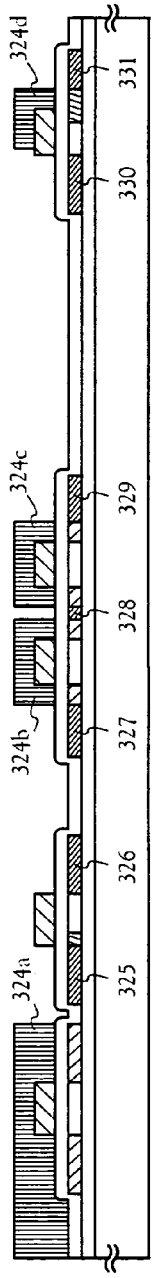

Resist masks 324a to 324c are formed next, with a shape covering the gate electrodes etc., as shown in FIG. 4B, and an n-type impurity element (phosphorous is used in embodiment 1) is added, forming impurity regions 325 to 331 containing a high concentration of phosphorous. Ion doping using phosphine (PH$_3$) is also performed here, and is regulated so that the phosphorous concentration of these regions is from $1 \times 10^{20}$ to $1 \times 10^{21}$ atoms/cm$^3$ (typically between $2 \times 10^{20}$ and $5 \times 10^{21}$ atoms/cm$^3$).

A source region or a drain region of the n-channel TFT is formed by this process, and in the switching TFT, a portion of the n-type impurity regions 320 to 322 formed by the process of FIG. 4A remains.

Figure 4C:
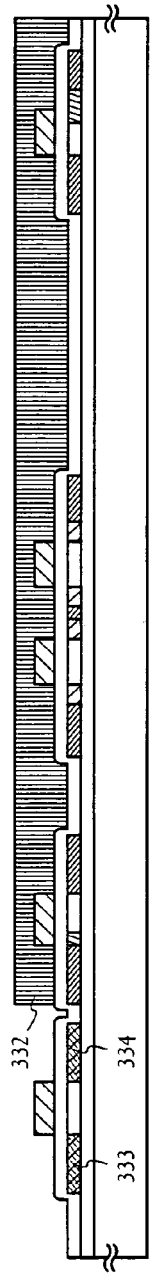

Next, as shown in FIG. 4C, the resist masks 324a to 324c are removed, and a new resist mask 332 is formed. A p-type impurity element (boron is used in embodiment 1) is then added, forming impurity regions 333 and 334 containing a high concentration of boron. Boron is added here at a concentration of $3 \times 10^{20}$ to $3 \times 10^{21}$ atoms/cm$^3$ (typically between $5 \times 10^{20}$ and $1 \times 10^{21}$ atoms/cm$^3$) by ion doping using diborane (B$_2$H$_6$).

Note that phosphorous has already been added to the impurity regions 333 and 334 at a concentration of $1 \times 10^{20}$ to $1 \times 10^{21}$ atoms/cm$^3$, but boron is added here at a concentration of at least 3 times more than that of the phosphorous. Therefore, the n-type impurity regions already formed completely invert to p-type, and function as p-type impurity regions.

Next, after the resist mask 332 is removed, the n-type or p-type impurity element added at each concentration is activated. As activating means, a furnace annealing method, a laser annealing method, or a lamp annealing method can be used. In this embodiment, a heat treatment in a nitrogen atmosphere at 550° C. for 4 hours is carried out in an electric heating furnace.

At this time, it is important to remove oxygen in the atmosphere to the utmost. This is because if oxygen exists even in a small amount, the exposed surface of the gate electrode is oxidized to cause the increase of resistance, and also it becomes difficult to make ohmic contact later. Thus, it is desirable that an oxygen concentration in the treatment atmosphere at the activation step is made 1 ppm or less, preferably 0.1 ppm or less.

Figure 4D:
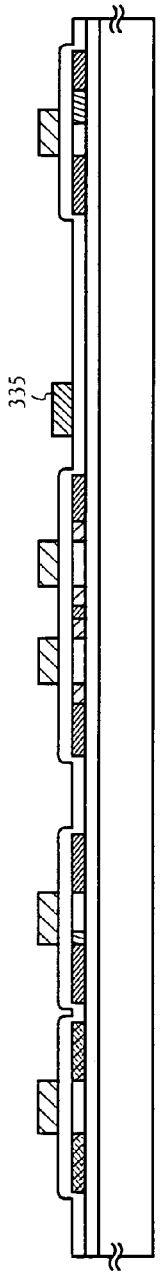

Next, after the activation step is ended, a gate wiring line 335 having a thickness of 300 nm is formed. As a material of the gate wiring line 335, a metal film containing aluminum (Al) or copper (Cu) as its main ingredient (constituting 50 to 100%) may be used. As an arrangement, it is formed so as to electrically connect the gate electrodes 314 and 315 of the switching TFT (FIG. 4D).

By adopting such structure, the wiring resistance of the gate wiring line can be made very low, so that an image display region (pixel portion) with a large area can be formed. That is, the pixel structure of this embodiment is very effective in realization of an EL display device having a screen of a size of not less than 10 inches in diagonal (further, 30 cm or more).

Figure 5A:
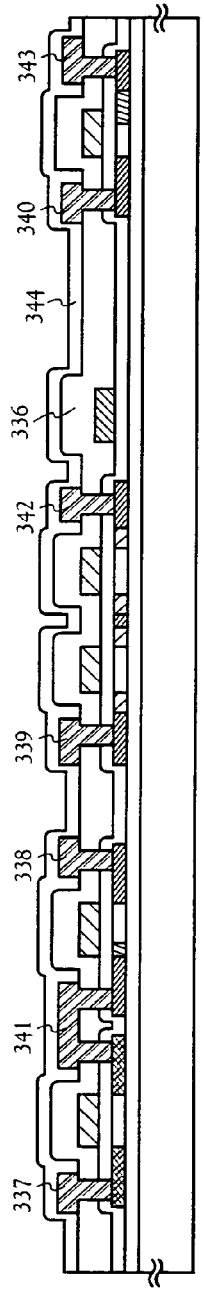
FIGS. 5A to 5C are views showing the fabricating process of the active matrix EL display device of Embodiment 1.

Next, as shown in FIG. 5A, a first interlayer insulating film 336 is formed. As the first interlayer insulating film 336, a single layer of an insulating film containing silicon may be used, or a laminate film of a combination of such films may be used. Besides, it is appropriate that the film thickness is made 400 nm to 1.5 μm. In this embodiment, such a structure is formed that a silicon oxide film with a thickness of 800 nm is laminated on a silicon nitride oxide film with a thickness of 200 nm.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 336. Namely, hydrogen processing may be performed as above after forming the 200 nm thick silicon nitride oxide film, and then the remaining 800 nm thick silicon oxide film may be formed.

Next, a contact hole is formed in the first interlayer insulating film 336, and source wiring lines 337 to 340 and drain wiring lines 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 344 is formed next with a thickness of 50 to 500 nm (typically between 200 and 300 nm). A 300 nm thick silicon nitride oxide film is used as the first passivation film 344 in embodiment 1. This may also be substituted by a silicon nitride film.

Note that it is effective to perform plasma processing using a gas containing hydrogen such as H$_2$ or NH$_3$ etc., before the formation of the silicon nitride oxide film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Figure 5B:
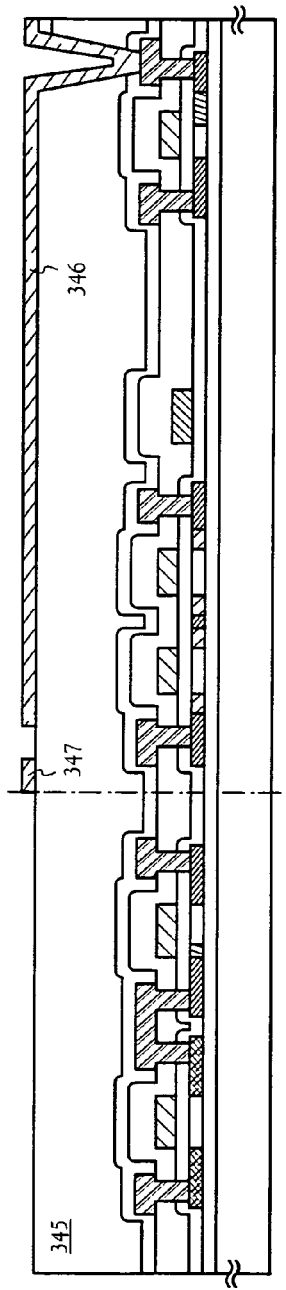

Next, as shown in FIG. 5B, a second interlayer insulating film 345 made of organic resin is formed. As the organic resin, it is possible to use polyimide, polyamide, acryl, BCB (benzocyclobutene) or the like. Especially, since the second interlayer insulating film 345 is primarily used for flattening, acryl excellent in flattening properties is preferable. In this embodiment, an acrylic film is formed to a thickness sufficient to flatten a stepped portion formed by TFTs. It is appropriate that the thickness is preferably made 1 to 5 μm (more preferably, 2 to 4 μm).

Next, a contact hole reaching the drain wiring line 343 is formed in the second interlayer insulating film 345 and the first passivation film 344, and a pixel electrode 346 is formed. In this embodiment, as the pixel electrode 346, an aluminum alloy film (aluminum film containing titanium of 1 wt %) with a thickness of 300 nm is formed. Note that reference numeral 347 designates an end portion of an adjacent pixel electrode.

Figure 5C:
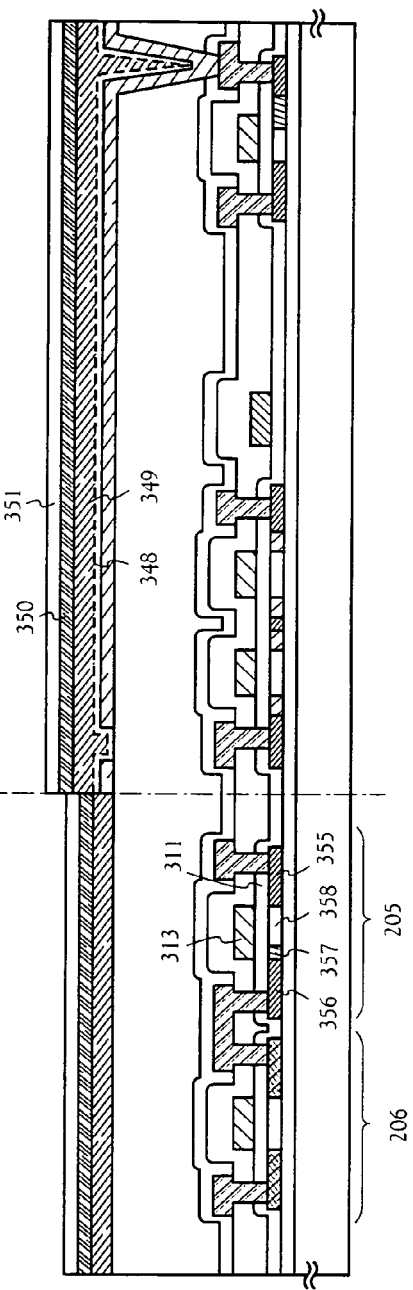

Next, as shown in FIG. 5C, an alkaline compound 348 is formed. In this embodiment, a lithium fluoride film is formed by an evaporation method to a thickness of 5 nm. Then, an EL layer 349 with a thickness of 100 nm is formed thereon by a spin coating method.

As an EL material making the EL layer 349, polymer organic materials such as polyparaphenylene vinylene (PPV) or polyfluorene and low molecular organic materials can be cited. Specifically, as the polymer organic material showing white luminescence, which becomes an luminescent layer, materials disclosed in Japanese Patent Application Laid-Open No. Hei. 8-96959 or No. Hei. 9-63770 may be used. For example, a material obtained by dissolving PVK (polyvinylcarbazole), Bu-PBD (2-(4'-tert-butylphenyl)-5-(4'-biphenyl)-1,3,4-oxadiazole), coumarin 6, DCM1 (4-dicyanomethylene-2-methyl-6-p-dimethylaminostyryl-4H-pyrane), TPB (tetraphenylbutadiene), or Nile red in 1,2-dichloromethane may be used. At this time, it is sufficient if the film thickness is made 30 to 150 nm (preferably, 40 to 100 nm). The above example is merely an example of organic materials which can be used for the EL layer of the present invention, and does not limit the present invention.

Besides, as described above, there are roughly four colorizing systems, and in this embodiment, a system of forming color filters corresponding to RGB for colorization was used. As the EL layer 349, a well-known material and structure may be used. However, in the present invention, a low molecular organic material capable of emitting white light was used. Note that the color filters corresponding to RGB may be positioned above the pixel electrode on the active matrix substrate. Besides, such a structure may be adopted that another substrate is bonded to the active matrix substrate so as to seal the EL element, and the color filters are provided on that substrate. Note that the color filters are not shown for simplification.

Besides, it is also possible to adopt a color display system in which an EL layer of blue or blue-green luminescence and a fluorescent material (fluorescent color conversion layer: CCM) are combined, or a system in which color display is made by stacking EL layers corresponding to RGB.

Note that in this embodiment, although the EL layer 349 is made a single layer structure of only the above luminescent layer, as the need arises, an electron injection layer, an electron transport layer, a hole transport layer, a hole injection layer, an electron blocking layer or a hole blocking layer may be provided.

Next, an anode 350 having a thickness of 200 nm and made of a transparent conductive film is formed to cover the EL layer 349. In this embodiment, a film made of a compound of indium oxide and zinc oxide is formed by an evaporation method, and patterning is carried out to make an anode.

Finally, by a plasma CVD method, a second passivation film 351 made of a silicon nitride film is formed to a thickness of 100 nm. This second passivation film 351 protects the EL layer 349 against moisture or the like. Besides, it also serves to release heat generated in the EL layer 349. In order to further raise the heat dissipation effect, it is also effective to laminate a silicon nitride film and a carbon film (preferably a diamond-like carbon film) to make a second passivation film.

In this way, an active matrix EL display device having a structure as shown in FIG. 5C is completed. In the active matrix EL display device of this embodiment, a TFT having an optimum structure is disposed in not only the pixel portion but also the driving circuit portion, so that very high reliability is obtained and operation characteristics can also be improved.

First, a TFT having a structure to decrease hot carrier injection so as not to drop the operation speed thereof as much as possible is used as an n-channel TFT of a CMOS circuit forming a driving circuit. Note that the driving circuit here includes a shift register, a buffer, a level shifter, a sampling circuit (sample and hold circuit) and the like. In the case where digital driving is made, a signal conversion circuit such as a D/A converter can also be included.

In the case of this embodiment, as shown in FIG. 5C, the active layer of the n-channel TFT 205 includes a source region 355, a drain region 356, an LDD region 357 and a channel formation region 358, and the LDD region 357 overlaps with the gate electrode 313, putting the gate insulating film 311 therebetween.

Consideration not to drop the operation speed is the reason why the LDD region is formed at only the drain region side. In this n-channel TFT, it is not necessary to pay much attention to an off current value, rather, it is better to give importance to an operation speed. Thus, it is desirable that the LDD region 357 is made to completely overlap with the gate electrode to decrease a resistance component to a minimum. That is, it is preferable to remove the so-called offset.

Besides, since deterioration due to hot carrier injection hardly becomes noticeable in the p-channel TFT of the CMOS circuit, an LDD region does not need to be particularly provided. Of course, it is also possible to provide an LDD region similar to the n-channel TFT to take a hot carrier countermeasure.

Note that, among the driving circuits, the sampling circuit is somewhat unique compared with the other sampling circuits, in that a large electric current flows in both directions in the channel forming region. Namely, the roles of the source region and the drain region are interchanged. In addition, it is necessary to control the value of the off current to be as small as possible, and with that in mind, it is preferable to use a TFT having functions which are on an intermediate level between the switching TFT and the current control TFT in the sampling circuit.

The foregoing structure can be easily realized by manufacturing TFTs in accordance with the manufacturing steps shown in FIGS. 3A to 5C. In this embodiment, although only the structures of the pixel portion and the driving circuit are shown, if the manufacturing steps of this embodiment are used, it is possible to form a logical circuit, such as a signal dividing circuit, a D/A converter circuit, an operational amplifier circuit, or the like other than the driving circuit on the same substrate, and further, it is believed that a memory portion, a microprocessor, or the like can be formed.

Figure 6:
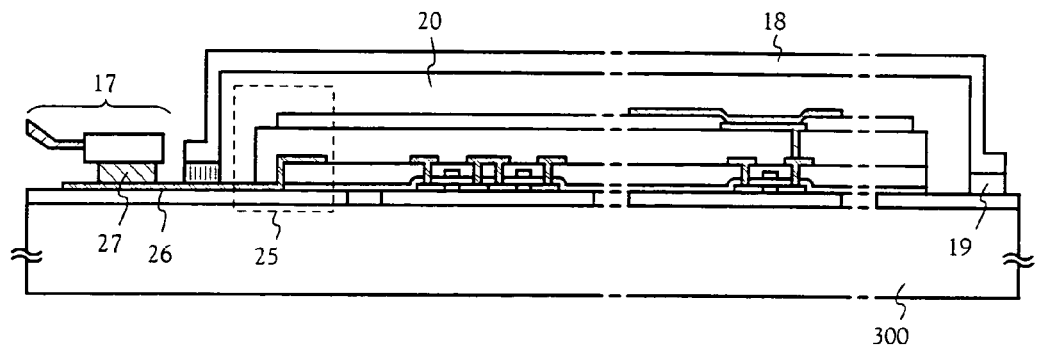
FIG. 6 is a sectional view of an EL display device of Embodiment 1.

When the process up to FIG. 5C has been completed, a sealing material (also referred to as a housing material) 18 is formed at this time so as to surround at least the pixel portion, and preferably the driver circuits and the pixel portion (FIG. 6). Note that a plate shape material possessing a concave portion so as to surround the element portion may also be used as the sealing material 18, and that ultraviolet hardened resin may also be used. The EL element is in a state of being completely enclosed in the airtight space at this point, and is completely cutoff from the atmosphere.

Further, it is desirable to fill a gap 20 between the sealing material 18 and the substrate 10 with an inert gas (argon, helium, nitrogen, etc.) or to provide a drying agent such as barium oxide in the gap. By this, it is possible to suppress deterioration of the EL element by moisture or the like.

Besides, after the sealing processing of the EL layer is completed, a connector (flexible printed circuit: FPC 17) for connecting a terminal extended from an element or a circuit formed on the substrate to an external signal terminal is attached so that a product is completed. Note that as shown in FIG. 6, a wiring line 26 is electrically connected to the FPC 17 through a gap (which is filled with an adhesive 19) between the sealing material 18 and the substrate 300.

Figure 7:
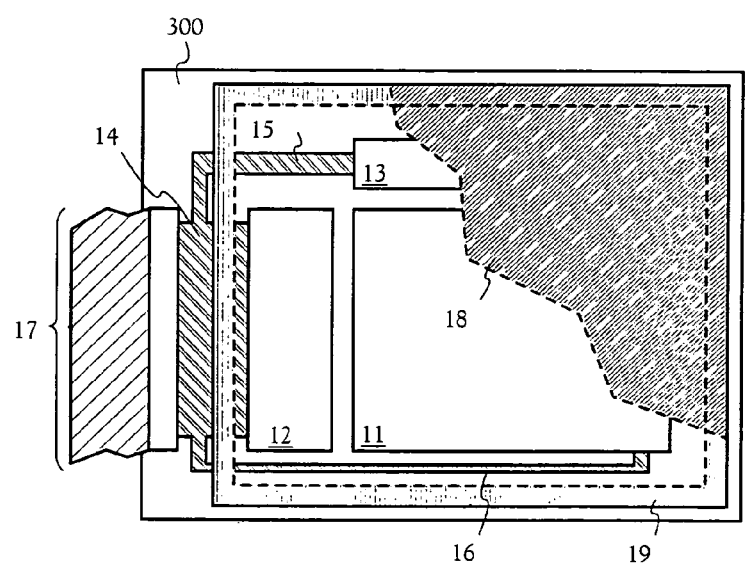
FIG. 7 is a top view of an EL display device of Embodiment 1.

Here, the structure of an active matrix EL display device of this embodiment will be described with reference to a top view of FIG. 7. In FIG. 7, reference numeral 300 designates a substrate; 11, a pixel portion; 12, a source side driving circuit; and 13, a gate side driving circuit. The respective driving circuits reach an FPC 17 through wiring lines 14 to 16 and are connected to an external equipment.

In the state as described above and shown in FIG. 7, an image can be displayed on the pixel portion by connecting the FPC 17 to a terminal of the external equipment. In the present specification, an article which comes to have a state where image display can be made by attaching an FPC is defined as an EL display device.

Note that in this embodiment, although there is shown an example in which output light of the EL element is outputted at the upper surface side of the active matrix substrate, such a structure may be adopted that an EL element is formed of a pixel electrode (anode) made of ITO/EL layer/MgAg electrode (cathode) in sequence from below. In this case, output light of the EL element is outputted to the substrate side (lower surface side of the active matrix substrate) at which a TFT is formed.

Embodiment 2

In the embodiment 1, the example in which the low molecular organic material giving white luminescence is used as the EL material constituting the EL layer, has been described. In this embodiment, an example in which three kinds of polymer organic material layers corresponding to R (red), G (green) and B (blue) are stacked, will be described. Note that since this embodiment is different from the embodiment 1 only in the EL materials, only that point will be described.

Instead of the low molecular organic material set forth in the embodiment 1, polymer organic materials (polyparaphenylene vinylene (PPV), polyfluorene, etc.) may be used. For example, cyanopolyphenylenevinylene was used for a red luminescent material, polyphenylenevinylene was used for a green luminescent material, and polyphenylenevinylene and polyalkylphenylene were used for a blue luminescent material.

By adopting the structure like this, luminescence (red luminescence, green luminescence, and blue luminescence) with high luminescent brightness can be obtained.

Embodiment 3

Laser crystallization is used as the means of forming the crystalline silicon film 302 in embodiment 1, and a case of using a different means of crystallization is explained in embodiment 3.

After forming an amorphous silicon film in embodiment 3, crystallization is performed using the technique recorded in Japanese Patent Application Laid-open No. Hei 7-130652. The technique described in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602.

In addition, a TFT may be formed using the technique recorded in the specification of Japanese Patent Application No. Hei 11-076967 by the applicant of the present invention.

The processes of manufacturing shown in embodiment 1 are one embodiment of the present invention, and provided that the structure of FIG. 5C of embodiment 1 can be realized, then other manufacturing process may also be used without any problems, as above. Note that it is possible to freely combine the constitution of embodiment 3 with the constitution of embodiment 2.

Embodiment 4

Cases of using top gate type TFTs were explained by embodiment 1, but the present invention is not limited to a TFT structure, and it may also be implemented using a bottom gate type TFT (typically an inverted stagger type TFT). Further, the inverted stagger type TFT may be formed by any means.

The inverted stager type TFT is a good structure having fewer processes than the top gate type TFT, and it is therefore extremely advantageous in lowering manufacturing costs, an object of the present invention. Note that it is possible to freely combine the constitution of embodiment 4 with the constitution of embodiment 2 and embodiment 3.

Embodiment 5

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the EL display device in accordance with the present invention can be used as a display portion of an EL display (i.e., a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggles-type display (head mount display), a car navigation system, a car audio equipment, note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a compact disc (CD), a laser disc (LD), a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 8A to 8F respectively show various specific examples of such electronic devices.

Figure 8A:
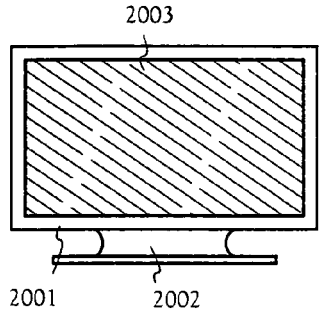
FIGS. 8A to 8F are views showing examples of electronic instruments of Embodiment 5.

FIG. 8A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 8B:
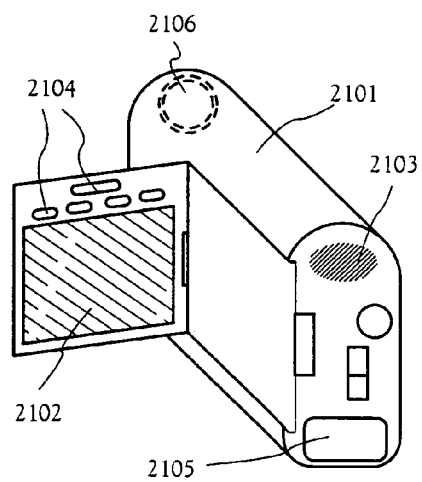

FIG. 8B illustrates a video camera which includes a main body 2101, a display portion 2102, an audio input portion 2103, operation switches 2104, a battery 2105, an image receiving portion 2106, or the like. The EL display device in accordance with the present invention can be used as the display portion 2102.

Figure 8C:
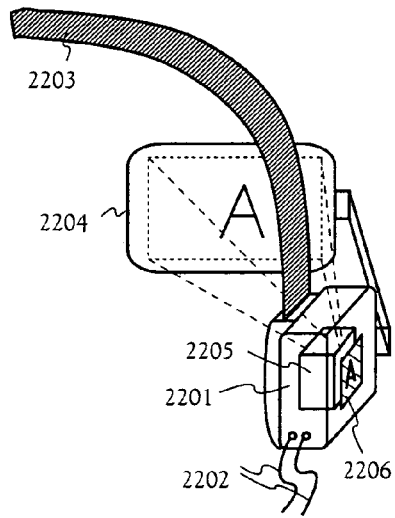

FIG. 8C illustrates a portion (the right-half piece) of an EL display of head mount type, which includes a main body 2201, signal cables 2202, a head mount band 2203, a display portion 2204, an optical system 2205, an EL display device 2206, or the like. The present invention is applicable to the EL display device 2206.

Figure 8D:
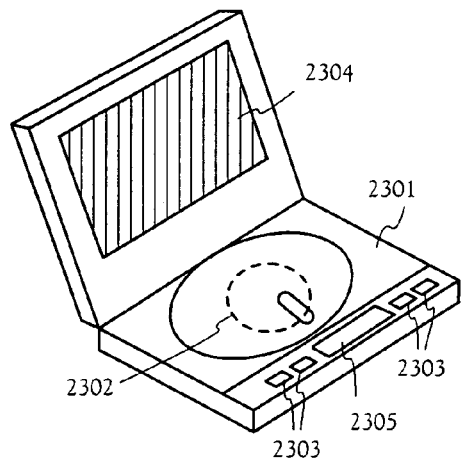

FIG. 8D illustrates an image reproduction apparatus including a recording medium (more specifically, a DVD reproduction apparatus), which includes a main body 2301, a recording medium (a CD, an LD, a DVD or the like) 2302, operation switches 2303, a display portion (a) 2304, another display portion (b) 2305 or the like. The display portion (a) is used mainly for displaying image information, while the display portion (b) is used mainly for displaying character information. The EL display device in accordance with the present invention can be used as these display portions (a) and (b). The image reproduction apparatus including a recording medium further includes a CD reproduction apparatus, a game machine or the like.

Figure 8E:
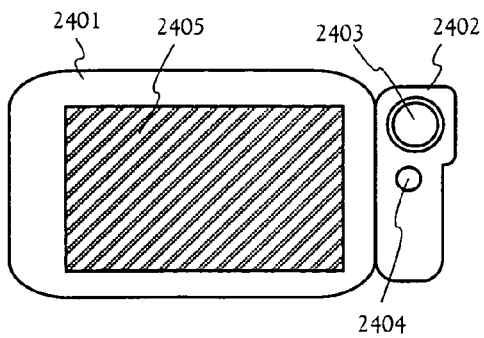

FIG. 8E illustrates a portable (mobile) computer which includes a main body 2401, a camera portion 2402, an image receiving portion 2403, operation switches 2404, a display portion 2405, or the like. The EL display device in accordance with the present invention can be used as the display portion 2405.

Figure 8F:
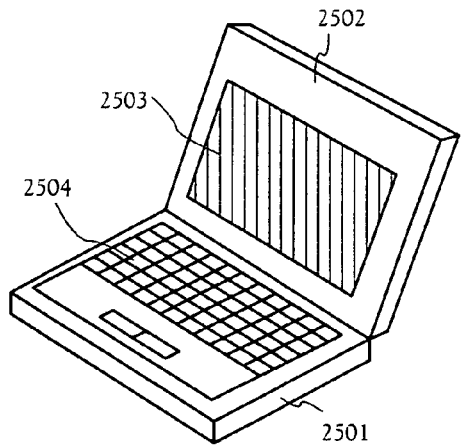

FIG. 8F illustrates a personal computer which includes a main body 2501, a frame 2502, a display portion 2503, a keyboard 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or a car audio equipment, it is desirable to drive the EL display device so that the character information is formed by a light-emitting portion while a non-emission portion corresponds to the background.

Figure 9A:
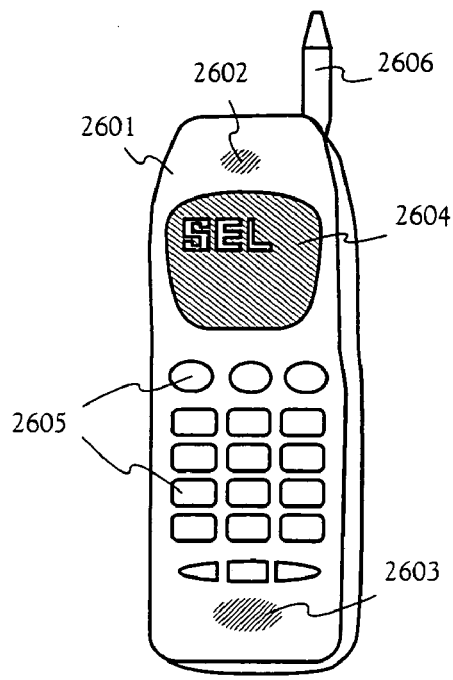
FIGS. 9A and 9B are views showing examples of electronic instruments of Embodiment 5.

With now reference to FIG. 9A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 9B:
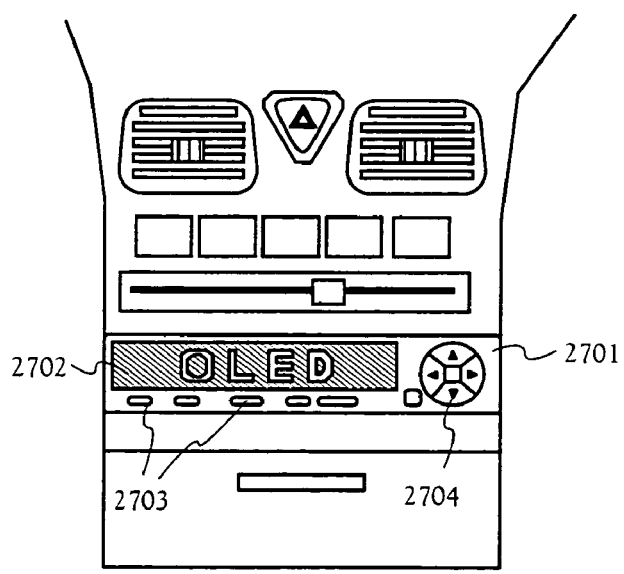

FIG. 9B illustrates a car audio equipment which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to a car audio of the set type. The display portion 2702 can reduce power consumption by displaying white-colored characters on a black-colored background, which is particularly advantageous for the car audio of the set type.

As set forth above, the present invention can be applied variously to a wide range of electronic devices in all fields. The electronic device in the present embodiment can be obtained by utilizing an EL display device having the configuration in which the structures in Embodiments 1 through 4 are freely combined.

In the present invention, since the means for gamma (γ)-correcting a signal applied to the pixel of the EL display device is provided, the EL display device including the EL element emitting light with the suitably controlled luminescent brightness is fabricated.

Besides, by using the EL display device of the present invention as a display portion, an inexpensive electronic device with high visibility can be obtained.

What is claimed is:
1. An electronic device comprising:
an EL display device including:
a thin film transistor;
an EL element that comprises a pixel electrode electrically connected to the thin film transistor, an EL layer formed over the pixel electrode, and an electrode formed over the EL layer;
an applying means for applying an image signal to the EL element;
an insulating layer over the EL element and the applying means for applying the image signal to the EL element, the insulating layer comprising a silicon nitride film and a carbon film; and
a correcting means for gamma (γ)-correcting the image signal, wherein the correcting means is configured to amplify a signal of red and attenuate a signal of blue or green, wherein the EL element comprises:
a first pixel comprising a blue luminescent layer,
a second pixel comprising a green luminescent layer, and
a third pixel comprising a red luminescent layer.

2. An electronic device according to claim 1, further comprising:
a memory for storing data for the gamma (γ)-correcting.

3. An electronic device according to claim 1, further comprising:
a color filter being formed at a position corresponding to the pixel electrode.

4. An electronic device according to claim 1,
wherein the gamma (γ)-correcting is independently applied for each of signals of blue, green and red.

5. An electronic device according to claim 1,
wherein the EL element comprises a luminescent layer comprising a polymer organic material.

6. An EL display device comprising:
a thin film transistor;
an EL element that comprises a pixel electrode electrically connected to the thin film transistor, an EL layer formed over the pixel electrode, and an electrode formed over the EL layer;
an applying means for applying an image signal to the EL element; and
a correcting means for gamma (γ)-correcting the image signal, wherein the correcting means is configured to amplify a signal of red and attenuate a signal of blue or green; and
an insulating layer over the EL element and the applying means for applying the image signal to the EL element, the insulating layer comprising a silicon nitride film and a carbon film,
wherein the thin film transistor, the pixel electrode, the EL element, the insulating layer, the applying means and the correcting means are formed over a same substrate, and
wherein the EL element comprises:
a first pixel comprising a blue luminescent layer,
a second pixel comprising a green luminescent layer, and
a third pixel comprising a red luminescent layer.

7. An EL display device according to claim 6, further comprising:
a memory for storing data for the gamma (γ)-correcting.

8. An EL display device according to claim 6,
wherein the EL display device is used in an electronic device selected from the group consisting of an EL display, a video camera, a head mount type display, an image reproduction device comprising a recording medium, a portable computer, a personal computer, a portable telephone and a car audio equipment.

9. A EL display device according to claim 6, further comprising:
a color filter being formed at a position corresponding to the pixel electrode.

10. An EL display device according to claim 6,
wherein the gamma (γ)-correcting is independently applied for each of signals of blue, green and red.

11. An EL display device according to claim 6,
wherein the EL element comprises a luminescent layer comprising a polymer organic material.

12. An electronic device according to claim 1,
wherein the electronic device is selected from the group consisting of an EL display, a video camera, a head mount type display, an image reproduction device comprising a recording medium, a portable computer, a personal computer, a portable telephone and a car audio equipment.

13. An electronic device comprising:
an EL display device comprising:
a thin film transistor;
an EL element that comprises a pixel electrode electrically connected to the thin film transistor, an EL layer formed over the pixel electrode, and an electrode formed over the EL layer;
a source driver circuit for applying an image signal to the EL element;
an insulating layer over the EL element and the source driver circuit, the insulating layer comprising a silicon nitride film and a carbon film; and
a correction circuit for gamma (γ)-correcting the image signal, wherein the correction circuit is configured to amplify a signal of red and attenuate a signal of blue or green,
wherein the EL element comprises:
a first pixel comprising a blue luminescent layer,
a second pixel comprising a green luminescent layer, and
a third pixel comprising a red luminescent layer.

14. An electronic device according to claim 13, further comprising:
a memory for storing data for the gamma (γ)-correcting.

15. An electronic device according to claim 13,
wherein the electronic device is selected from the group consisting of an EL display, a video camera, a head mount type display, an image reproduction device comprising a recording medium, a portable computer, a personal computer, a portable telephone and a car audio equipment.

16. An electronic device according to claim 13, further comprising:
a color filter being formed at a position corresponding to the pixel electrode.

17. An electronic device according to claim 13,
wherein the gamma (γ)-correcting is independently applied for each of signals of blue, green and red.

18. An electronic device according to claim 13,
wherein the EL element comprises a luminescent layer comprising a polymer organic material.

19. An EL display device comprising:
a thin film transistor;
an EL element that comprises a pixel electrode electrically connected to the thin film transistor, an EL layer formed over the pixel electrode, and an electrode formed over the EL layer;
a source driver circuit for applying an image signal to the EL element;
an insulating layer over the EL element and the source driver circuit, the insulating layer comprising a silicon nitride film and a carbon film; and
a correction circuit for gamma (γ)-correcting the image signal, wherein the correction circuit is configured to amplify a signal of red and attenuate a signal of blue or green,
wherein the thin film transistor, the pixel electrode, the EL element, the insulating layer, the source driver circuit and the correction circuit are formed over a same substrate, and wherein the EL element comprises:
a first pixel comprising a blue luminescent layer,
a second pixel comprising a green luminescent layer, and
a third pixel comprising a red luminescent layer.

20. An EL display device according to claim 19, further comprising:
a memory for storing data for the gamma (γ)-correcting.

21. An EL display device according to claim 19,
wherein the EL display device is used in an electronic device selected from the group consisting of an EL display, a video camera, a head mount type display, an image reproduction device comprising a recording medium, a portable computer, a personal computer, a portable telephone and a car audio equipment.

22. An EL display device according to claim 19, further comprising:
a color filter being formed at a position corresponding to the pixel electrode.

23. An EL display device according to claim 19,
wherein the gamma (γ)-correcting is independently applied for each of signals of blue, green and red.

24. An EL display device according to claim 19,
wherein the EL element comprises a luminescent layer comprising a polymer organic material.

* * * * *

UNITED STATES PATENT AND TRADEMARK OFFICE
CERTIFICATE OF CORRECTION

| | | |
|---|---|---|
| PATENT NO. | : 7,786,958 B1 | Page 1 of 1 |
| APPLICATION NO. | : 09/666521 | |
| DATED | : August 31, 2010 | |
| INVENTOR(S) | : Jun Koyama | |

It is certified that error appears in the above-identified patent and that said Letters Patent is hereby corrected as shown below:

- Column 7, lines 65-66: "zimpurity" should be corrected to "impurity"
- Column 8, line 54: add "to" between "connected" and "the"
- Column 11, line 33: "butytphenyl" should be corrected to "butylphenyl"
- Column 17, line 53 (beginning Claim 9) "A" should be corrected to "An"

Signed and Sealed this
Fifteenth Day of March, 2011

David J. Kappos
*Director of the United States Patent and Trademark Office*